United States Patent
Ueno et al.

(10) Patent No.: US 12,119,208 B2
(45) Date of Patent: Oct. 15, 2024

(54) HIGH-FREQUENCY POWER SUPPLY DEVICE

(71) Applicant: DAIHEN Corporation, Osaka (JP)

(72) Inventors: Yuya Ueno, Osaka (JP); Yuichi Hasegawa, Osaka (JP)

(73) Assignee: DAIHEN Corporation, Osaka (JP)

( * ) Notice: Subject to any disclaimer, the term of this patent is extended or adjusted under 35 U.S.C. 154(b) by 115 days.

(21) Appl. No.: 18/085,191

(22) Filed: Dec. 20, 2022

(65) Prior Publication Data

US 2023/0207268 A1   Jun. 29, 2023

(30) Foreign Application Priority Data

Dec. 28, 2021 (JP) ................. 2021-214969

(51) Int. Cl.
*H01J 37/00* (2006.01)
*H01J 37/32* (2006.01)

(52) U.S. Cl.
CPC .. *H01J 37/32183* (2013.01); *H01J 37/32155* (2013.01); *H01J 37/32165* (2013.01)

(58) Field of Classification Search
CPC ........... H01J 37/32165; H01J 37/32183; H01J 37/32155
See application file for complete search history.

(56) References Cited

U.S. PATENT DOCUMENTS

| | | | | |
|---|---|---|---|---|
| 5,116,482 A | * | 5/1992 | Setoyama | C23C 14/54 204/298.34 |
| 5,314,603 A | * | 5/1994 | Sugiyama | H01J 37/32935 156/345.47 |
| 7,615,983 B2 | | 11/2009 | Hamaishi et al. | |
| 9,947,514 B2 | | 4/2018 | Radomski et al. | |
| 11,158,488 B2 | * | 10/2021 | Radomski | H01J 37/32146 |
| 2006/0232471 A1 | * | 10/2006 | Coumou | H01J 37/32082 342/450 |
| 2007/0076344 A1 | | 4/2007 | Hamaishi et al. | |
| 2012/0212135 A1 | * | 8/2012 | Suzuki | H01J 37/32935 315/111.21 |

(Continued)

FOREIGN PATENT DOCUMENTS

| | | |
|---|---|---|
| JP | 2007-103102 A | 4/2007 |
| JP | 2018-536295 A | 12/2018 |

*Primary Examiner* — Tuan T Lam
(74) *Attorney, Agent, or Firm* — Rimon P.C.

(57) ABSTRACT

A high-frequency power supply device includes: a first power supply that supplies first high-frequency power to a load by outputting a first high-frequency voltage having a first fundamental frequency; a second power supply that supplies second high-frequency power to the load by outputting a second high-frequency voltage having a second fundamental frequency lower than the first fundamental frequency; a first matching unit between the first power supply and the load; and a second matching unit between the second power supply and the load. When frequency-modulating the first high-frequency voltage with a modulation signal having a same frequency as the second fundamental frequency to output a modulated wave, the first power supply repeatedly performs search processing of a start phase of the modulation signal and search processing of a frequency shift amount of the modulated wave such that magnitude of a reflection coefficient or magnitude of reflected wave power reduces.

4 Claims, 7 Drawing Sheets

(56) References Cited

U.S. PATENT DOCUMENTS

| | | | |
|---|---|---|---|
| 2017/0062187 A1* | 3/2017 | Radomski | H01J 37/32155 |
| 2023/0207263 A1* | 6/2023 | Hasegawa | H01J 37/32146 |
| | | | 327/540 |
| 2023/0207264 A1* | 6/2023 | Hasegawa | H01J 37/32174 |
| | | | 307/52 |
| 2023/0207269 A1* | 6/2023 | Hasegawa | H01J 37/32128 |
| | | | 307/52 |
| 2023/0207270 A1* | 6/2023 | Hasegawa | H01J 37/32183 |
| | | | 315/111.21 |

* cited by examiner

HIGH-FREQUENCY POWER SUPPLY DEVICE

CROSS-REFERENCE TO RELATED APPLICATIONS

This application is based upon and claims the benefit of priority from Japanese Patent Application No. 2021-214969, filed on Dec. 28, 2021, the entire contents of which are incorporated herein by reference.

FIELD

The present disclosure relates to a high-frequency power supply device.

BACKGROUND

A high-frequency power supply device used in a plasma processing apparatus includes two high-frequency power supplies (a first power supply and a second power supply), and outputs high-frequency voltages having different fundamental frequencies (frequencies of fundamental waves) from the respective power supplies to a load. For example, the first power supply supplies first high-frequency power to the load by outputting a first high-frequency voltage having a first fundamental frequency F1 suitable for plasma generation. The second power supply supplies second high-frequency power to the load by outputting a second high-frequency voltage having a second fundamental frequency F2 (the first fundamental frequency F1>the second fundamental frequency F2) suitable for accelerating ions. (refer to JP 2007-103102 A and JP 2018-536295 A).

In such a case, intermodulation distortion (IMD) occurs, and a phenomenon in which reflected wave power fluctuates according to the cycle of the second fundamental frequency F2 occurs on the first power supply side. In order to reduce the reflected wave power caused by the intermodulation distortion, there is known a technique of performing frequency modulation control on the first high-frequency voltage. In this case, if the start phase of the modulation signal and the frequency shift amount of the modulated wave in the frequency modulation control are not appropriate, there is a possibility that the intermodulation distortion cannot be effectively suppressed.

The present disclosure provides a high-frequency power supply device capable of effectively suppressing intermodulation distortion.

SUMMARY

A high-frequency power supply device according to the present disclosure includes a first power supply, a second power supply, a first matching unit, and a second matching unit. The first power supply supplies first high-frequency power to a load by outputting a first high-frequency voltage. The first high-frequency voltage has a first fundamental frequency. The second power supply supplies second high-frequency power to the load by outputting a second high-frequency voltage. The second high-frequency voltage has a second fundamental frequency. The second fundamental frequency is lower than the first fundamental frequency. The first matching unit is connected between the first power supply and the load. The second matching unit is connected between the second power supply and the load. When performing frequency modulation control, the first power supply repeatedly performs search processing of a start phase of a modulation signal and search processing of a frequency shift amount of a modulated wave such that magnitude of a reflection coefficient or magnitude of reflected wave power reduces. The frequency modulation control is a control for frequency-modulating the first high-frequency voltage with a modulation signal and outputting it as a modulated wave. The modulation signal has the same frequency as the second fundamental frequency.

DETAILED DESCRIPTION

Embodiments

Figure 1:
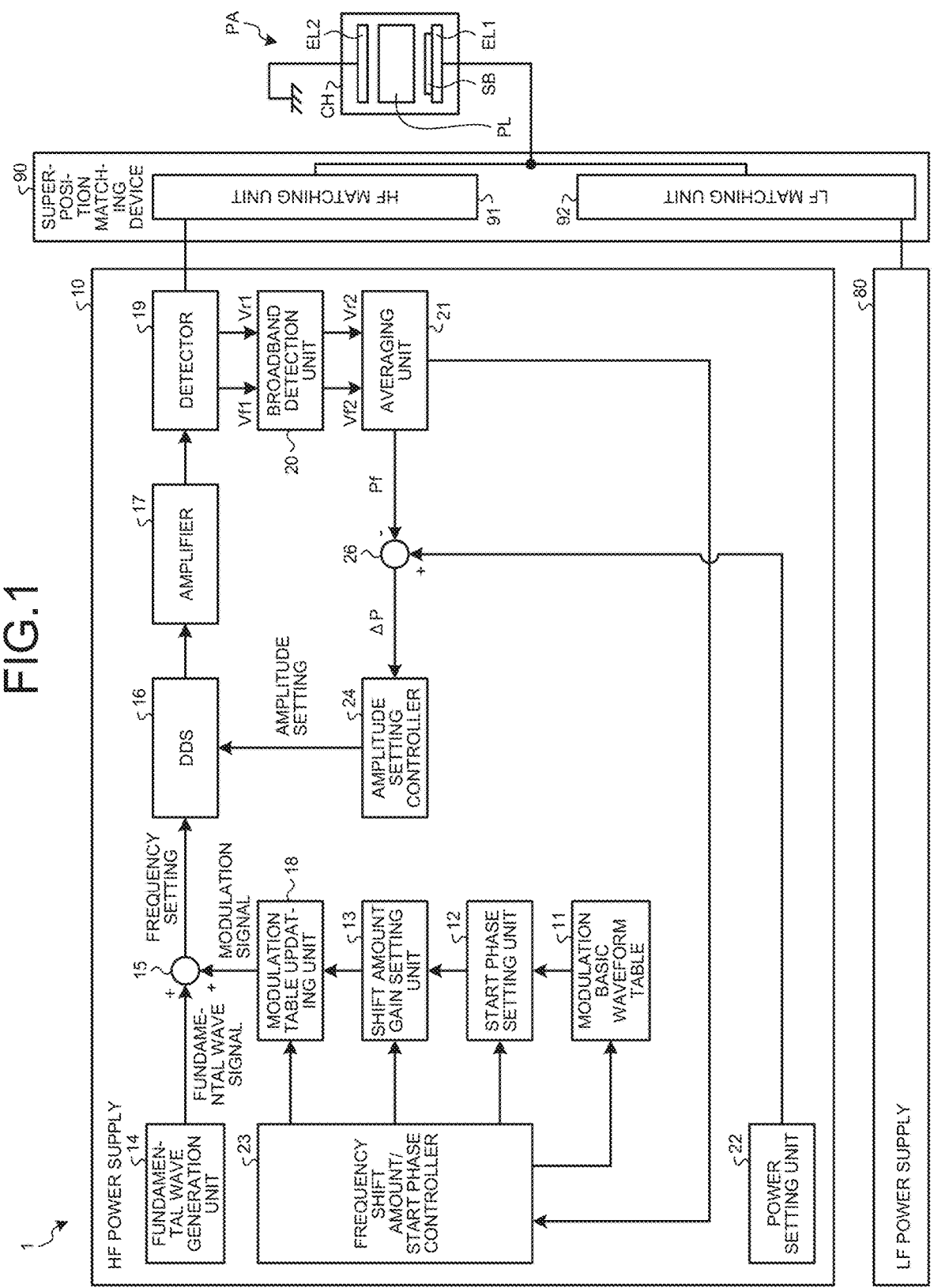
FIG. 1 is a diagram illustrating a configuration of a high-frequency power supply device according to an embodiment.

A high-frequency power supply device 1 may be configured as illustrated in FIG. 1. FIG. 1 is a diagram illustrating the configuration of the high-frequency power supply device 1. Note that the high-frequency voltage output from a first power supply and directed to a load is referred to as a first traveling wave voltage, and the high-frequency voltage reflected from a load side and returned to the first power supply is referred to as a first reflected wave voltage. The high-frequency voltage output from a second power supply and directed to the load is referred to as a second traveling wave voltage, and the high-frequency voltage reflected from the load side and returned to the second power supply is referred to as a second reflected wave voltage. FIG. 1 is a diagram illustrating the configuration of the high-frequency power supply device 1. The high-frequency power supply device 1 is applied to a plasma processing apparatus PA. The plasma processing apparatus PA is, for example, a parallel plate type, and a lower electrode EL1 and an upper electrode EL2 face each other in a chamber CH. A substrate SB to be processed can be placed on the lower electrode EL1.

The high-frequency power supply device 1 includes an HF power supply (first power supply) 10, an LF power supply (second power supply) 80, and a superposition matching device 90. The HF power supply 10 supplies first high-frequency power (first traveling wave power) to a load by outputting a first high-frequency voltage (first traveling wave voltage) having a first fundamental frequency F1. The first high-frequency voltage mainly has a relatively high first fundamental frequency F1 suitable for generating a plasma.

The first fundamental frequency F1 is, for example, 13.56 MHz, 27.12 MHz, and 40.68 MHz. The HF power supply 10 is also referred to as a source power supply.

The LF power supply 80 supplies second high-frequency power (second traveling wave power) to the load by outputting a second high-frequency voltage (second traveling wave voltage) having a second fundamental frequency F2 lower than the first fundamental frequency F1. The second high-frequency voltage has a relatively low second fundamental frequency F2 suitable for accelerating ions. The second fundamental frequency F2 is, for example, 400 kHz. The LF power supply 80 is also referred to as a bias power supply.

The superposition matching device 90 is electrically connected to each of the HF power supply 10 and the LF power supply 80. The superposition matching device 90 is electrically connected between the HF power supply 10 and the LF power supply 80, and the lower electrode EL 1. The superposition matching device 90 performs a first matching operation for matching the impedance on the HF power supply 10 side with the impedance on the lower electrode EL1 side, and performs a second matching operation for matching the impedance on the LF power supply 80 side with the impedance on the lower electrode EL1 side. In a state where the first matching operation and the second matching operation are performed, the superposition matching device 90 receives the first high-frequency power from the HF power supply 10, receives the second high-frequency power from the LF power supply 80, superposes the first high-frequency power and the second high-frequency power, and supplies the superposed power to the lower electrode EL1.

Note that the high-frequency power supply device 1 and the plasma processing apparatus PA are not limited to the configuration in FIG. 1. For example, there are various configurations such as a configuration in which the first high-frequency power output from the HF power supply 10 is supplied to the upper electrode EL2 via the superposition matching device 90, and the second high-frequency power output from the LF power supply 80 is supplied to the lower electrode EL1 via the superposition matching device 90. The high-frequency power supply device 1 can also be used for such other configurations.

The superposition matching device 90 includes an HF matching unit (first matching unit) 91 and an LF matching unit (second matching unit) 92. The HF matching unit 91 is electrically connected between the HF power supply 10 and the lower electrode EL1. The LF matching unit 92 is electrically connected between the LF power supply 80 and the lower electrode EL1. The HF matching unit 91 performs a first matching operation, and the LF matching unit 92 performs a second matching operation.

The HF power supply 10 performs frequency modulation control for frequency-modulating the first high-frequency voltage with a modulation signal having the same frequency as the second fundamental frequency F2 and outputting it as a modulated wave. When performing frequency modulation control, the HF power supply 10 repeatedly performs search processing of the start phase θst of the modulation signal and search processing of the frequency shift amount ΔF of the modulated wave such that the magnitude of the reflection coefficient or the magnitude of the reflected wave power reduces. The HF power supply 10 includes a frequency shift amount/start phase controller 23, a modulation basic waveform table 11, a start phase setting unit 12, a shift amount gain setting unit 13, a modulation table updating unit 18, a fundamental wave generation unit 14, an adder 15, a direct digital synthesizer (DDS) 16, an amplification unit (amplifier) 17, a detector 19, a broadband detection unit 20, an averaging unit 21, a power setting unit 22, an amplitude setting controller 24, and a subtractor 26.

The HF power supply 10 receives an LF synchronization trigger signal having the same frequency as the second fundamental frequency F2 from the outside (e.g., the LF matching unit 92 or a host control device not illustrated). The LF synchronization trigger signal is supplied to the frequency shift amount/start phase controller 23.

The frequency shift amount/start phase controller 23 supplies an LF synchronization trigger signal to the start phase setting unit 12, the shift amount gain setting unit 13, and the modulation table updating unit 18 as a timing signal for instructing the start of processing. Note that the frequency shift amount/start phase controller 23 may supply a timing signal different from the LF synchronization trigger signal to the start phase setting unit 12 and the shift amount gain setting unit 13. For example, the timing signal may have a higher frequency (shorter cycle time) than that of the LF synchronization trigger signal.

Figure 2:
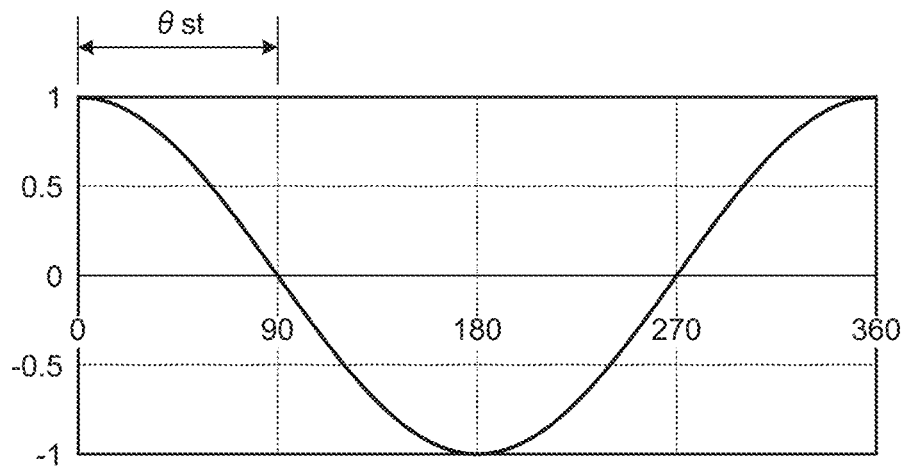
FIG. 2 is an image diagram of a modulation basic waveform stored in a modulation basic waveform table in the embodiment.

As illustrated in FIG. 2, the modulation basic waveform table 11 stores amplitude information for one cycle of the second fundamental frequency F2 (e.g., 400 kHz) at predetermined phase intervals. The waveform data of the sine wave represented by the amplitude information for one cycle is referred to as a "modulation basic waveform".

The phase interval of the amplitude information in the modulation basic waveform varies depending on the control cycle of the frequency shift amount/start phase controller 23. For example, if the frequency shift amount/start phase controller 23 operates in a control cycle of 100 MHz, the frequency is divided into 250 divisions (100 MHz/400 kHz), and thus amplitude information at each phase interval of 1.44 degrees (360/250) is stored in the modulation basic waveform table 11. If the frequency shift amount/start phase controller 23 operates in a control cycle of 500 MHz, the frequency is divided into 1250 divisions (500 MHz/400 kHz), and thus amplitude information at each phase interval of 0.288 degrees (360/1250) is stored in the modulation basic waveform table 11. The control cycle is set based on the system clock.

The amplitude of the modulation basic waveform stored in the modulation basic waveform table 11 is a predetermined reference amplitude (e.g., the magnitude of the amplitude is ±1). Note that the waveform data of the modulation basic waveform can be supplied to the modulation basic waveform table 11 via the frequency shift amount/start phase controller 23.

The start phase setting unit 12 reads a modulation basic waveform from the modulation basic waveform table 11 according to the timing signal supplied from the frequency shift amount/start phase controller 23. The start phase setting unit 12 then sets a start phase θst at which modulation in the modulation basic waveform is to be started. A method of determine the start phase will be described later in the description. The start phase setting unit 12 then shifts the modulation basic waveform in the time direction such that the waveform is started from the start phase θst. The shifted modulation basic waveform is supplied to the shift amount gain setting unit 13.

For example, as illustrated in FIG. 2, the start phase setting unit 12 sets the phase of the phase difference θst from the reference phase (e.g., zero degrees) as the start phase θst. In the example illustrated in FIG. 2, since the start phase θst is set to 90 degrees, the modulation basic waveform is data from 90 degrees to 450 degrees. For data from 360 degrees to 450 degrees, data from zero degrees to 90 degrees is used.

The shift amount gain setting unit 13 sets the frequency shift amount ΔF according to the timing signal supplied from the frequency shift amount/start phase controller 23. The frequency shift amount ΔF may vary in a range from −ΔFmax to +ΔFmax. For example, ΔFmax=1.2 MHz. A method of determine the frequency shift amount ΔF will be described later in the description. The frequency shift amount in frequency-modulating the fundamental wave signal of the first fundamental frequency F1 output from the fundamental wave generation unit 14 to be described below is represented by the amplitude of the modulation basic waveform. Therefore, the amplitude of the modulation basic waveform is changed by multiplying the modulation basic waveform by a gain corresponding to the frequency shift amount ΔF, and the frequency shift amount ΔF can be set. The modulation basic waveform after the amplitude change is supplied to the modulation table updating unit 18.

The modulation table updating unit 18 stores the modulation basic waveform supplied from the shift amount gain setting unit 13. The modulation table updating unit 18 supplies the stored modulation basic waveform to the adder 15 as a modulation signal according to the timing signal supplied from the frequency shift amount/start phase controller 23. The modulation basic waveform includes information on the start phase θst and the frequency shift amount ΔF.

The fundamental wave generation unit 14 generates a fundamental wave signal having the first fundamental frequency F1. Specifically, the fundamental wave generation unit 14 operates in the same control cycle as the frequency shift amount/start phase controller 23, and generates a signal including amplitude information indicating the first fundamental frequency F1 for each control cycle. The fundamental wave generation unit 14 supplies the generated fundamental wave signal to the adder 15.

The adder 15 receives the fundamental wave signal from the fundamental wave generation unit 14 and receives the modulation signal from the modulation table updating unit 18. The adder 15 adds the modulation signal to the fundamental wave signal. The addition result is supplied to the direct digital synthesizer 16 as frequency setting information.

Figure 3:
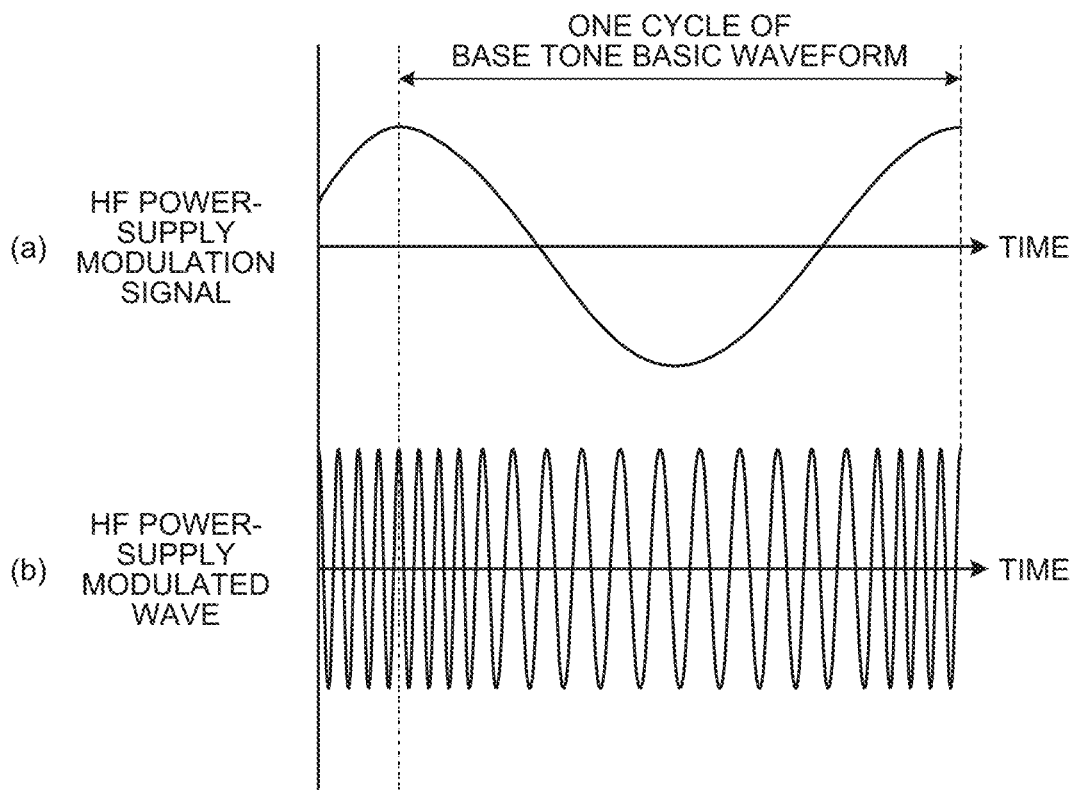
FIG. 3 is a diagram illustrating a modulation signal and a modulated wave in the embodiment.

The direct digital synthesizer 16 receives the frequency setting information from the adder 15 and receives the amplitude information from the amplitude setting controller 24. The direct digital synthesizer 16 generates a modulated wave by using the frequency setting information and the amplitude information. The direct digital synthesizer 16 supplies the generated modulated wave to the amplification unit 17. Note that the cycle of the modulation signal is the cycle of the modulation basic waveform, the start phase θst and the frequency shift amount ΔF are reflected, and the modulation signal is a waveform signal as illustrated at (a) in FIG. 3. Since the fundamental wave signal is frequency-modulated with the modulation signal, the modulated wave as illustrated at (b) in FIG. 3 is obtained.

The amplification unit 17 amplifies the high-frequency signal output from the direct digital synthesizer 16. The amplification unit 17 outputs the amplified high-frequency signal (first traveling wave voltage) to the superposition matching device 90.

The detector 19 detects the first traveling wave voltage from the amplification unit 17, outputs a traveling wave voltage detection signal Vf1 as a detection signal, detects the first reflected wave voltage reflected from the plasma processing apparatus PA side via the superposition matching device 90, and outputs a reflected wave voltage detection signal Vr1 as a detection signal. The detector 19 supplies the detected traveling wave voltage detection signal Vf1 and reflected wave voltage detection signal Vr1 to the broadband detection unit 20.

The broadband detection unit 20 is a filter for passing a desired frequency component, calculates by, for example, a superheterodyne method and performs filtering processing, thereby passing each of the traveling wave voltage detection signal Vf2, which is a desired component of the traveling wave voltage detection signal Vf1, and the reflected wave voltage detection signal Vr2, which is a desired component of the reflected wave voltage detection signal Vr1, and supplying the signals to the averaging unit 21.

The averaging unit 21 calculates traveling wave power Pf based on the traveling wave voltage detection signal Vf2 and calculates reflected wave power Pr based on the reflected wave voltage detection signal Vr2. For example, the traveling wave power Pf can be calculated by $Vf2^2/R$ (R: gain corresponding to a resistance value). The reflected wave power Pr can be calculated in the same manner. Note that, in the above calculation formula, Vf2 represents the magnitude of the traveling wave voltage detection signal Vf2. As is obvious, a gain for conversion into an actual power value is multiplied.

The averaging unit 21 accumulates each of the calculated traveling wave power Pf and the calculated reflected wave power Pr in a predetermined period. Further, the averaging unit 21 averages each of the traveling wave power Pf and the reflected wave power Pr for a predetermined period. The averaging unit 21 supplies the average power of the traveling wave power Pf to the subtractor 26. The averaging unit 21 supplies the average power of the traveling wave power Pf and the average power of the reflected wave power Pr to the frequency shift amount/start phase controller 23. Note that although the above description illustrates an example in which the averaging is performed after the power is calculated based on the voltage, the power may be calculated after the voltage is averaged.

The power setting unit 22 sets target power in advance. The power setting unit 22 supplies the target power to the subtractor 26. The subtractor 26 subtracts the average power of the traveling wave power Pf from the target power, and feeds back the subtraction result to the amplitude setting controller 24 as an error ΔP. The amplitude setting controller 24 controls the amplitude of the modulated wave according to the error ΔP. In other words, the amplitude setting controller 24 obtains the amplitude of the modulated wave according to the error ΔP (e.g., such that the error ΔP reduces), and supplies the amplitude setting according to the obtained amplitude to the direct digital synthesizer 16.

For example, if the target power is 1,000 [W] and the average power of the traveling wave power Pf is 950 [W], the amplitude setting controller 24 controls the amplitude of the modulated wave so as to increase the traveling wave power Pf to be supplied to the load because 50 [W] is short of the target power. A known method such as PI control or PID control can be used to control the amplitude of the modulated wave.

The frequency shift amount/start phase controller 23 receives the average power of the traveling wave power Pf and the average power of the reflected wave power Pr fed back from the averaging unit 21. The frequency shift amount/start phase controller 23 changes the start phase of the modulation signal within a predetermined range in a state where the frequency shift amount ΔF of the modulated wave is fixed such that the average power of the reflected wave power Pr or the reflection coefficient Γ is minimized. The frequency shift amount/start phase controller 23 changes the frequency shift amount ΔF of the modulated wave within a predetermined range in a state where the start phase of the modulation signal is fixed such that the average power of the reflected wave power Pr or the reflection coefficient Γ is minimized.

Note that the reflection coefficient Γ can be calculated by, for example, ∞(Pr/Pf). An example has been illustrated in which the average power of the traveling wave power Pf and the average power of the reflected wave power Pr are fed back from the averaging unit 21 to the frequency shift amount/start phase controller 23. However, when the frequency shift amount/start phase controller 23 controls the start phase θst and the frequency shift amount ΔF by the reflected wave power Pr without using the reflection coefficient Γ, only the average power of the reflected wave power Pr may be fed back.

Figure 4:
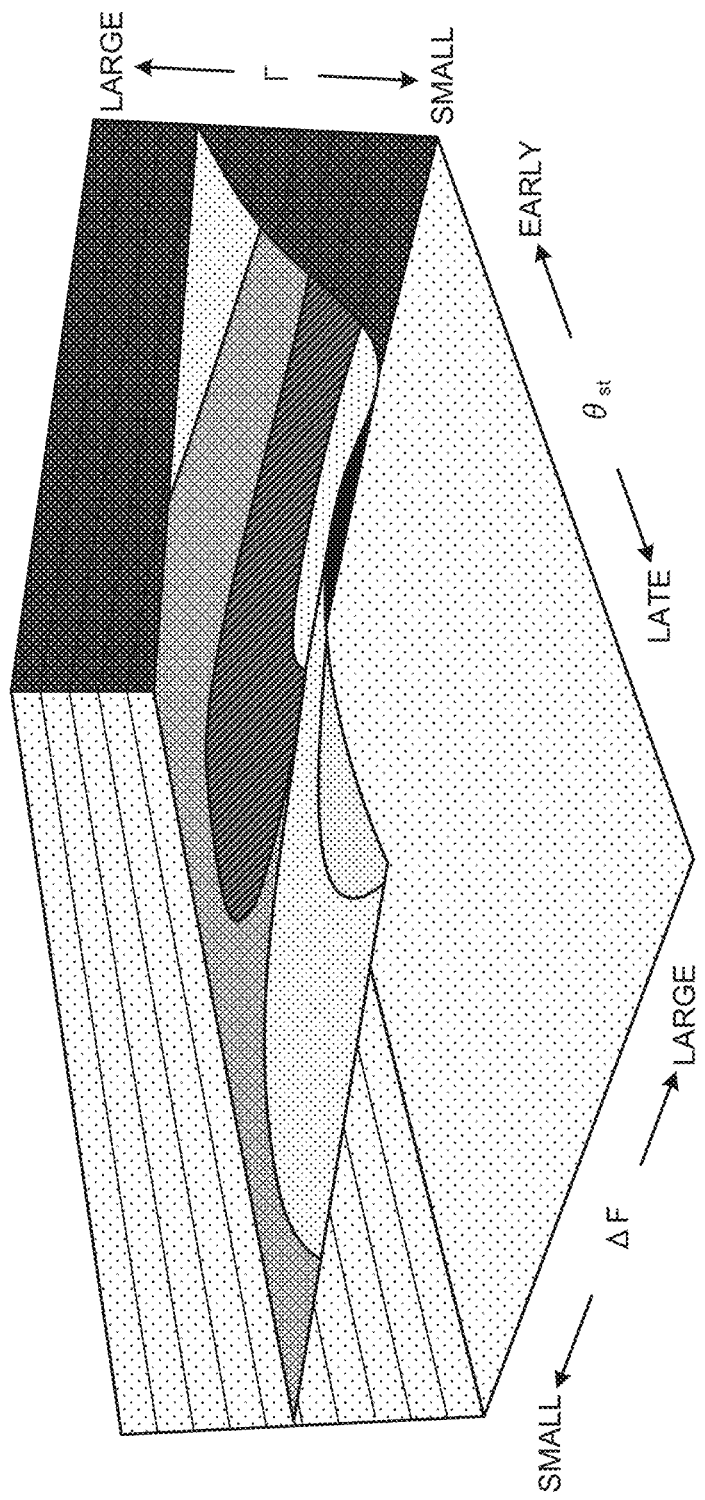
FIG. 4 is a diagram illustrating a relationship between a start phase of the modulation signal, a frequency shift amount of the modulated wave, and a reflection coefficient in the embodiment.
Figure 5:
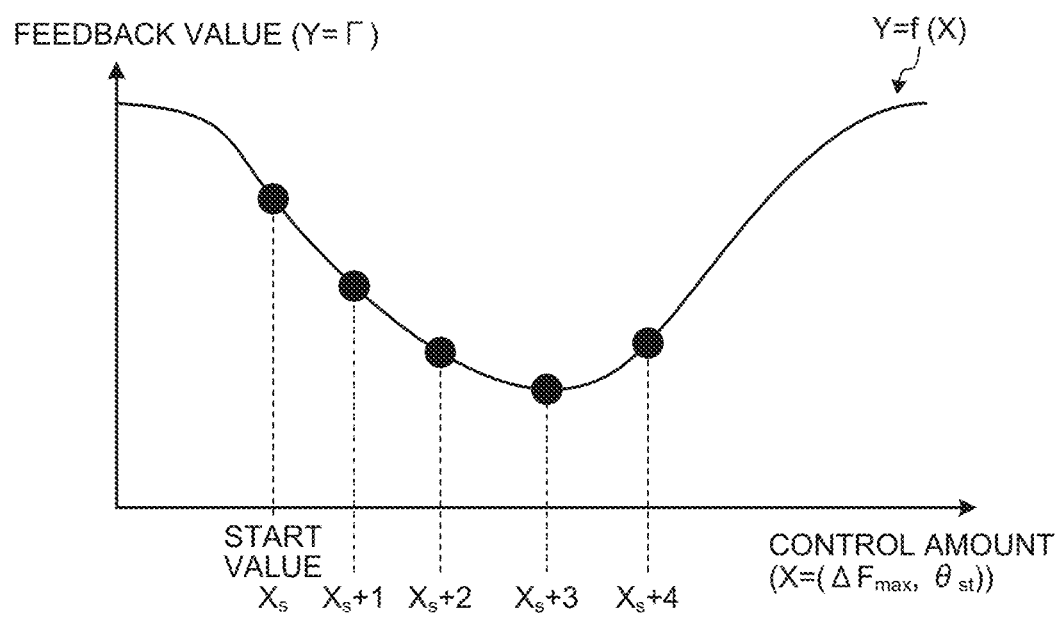
FIG. 5 is a diagram illustrating a concept of a gradient method in the embodiment.

The outline of the frequency modulation control will now be described with reference to FIGS. 4 and 5. When performing frequency modulation control, the HF power supply 10 repeatedly performs search processing of the start phase θst of the modulation signal and search processing of the frequency shift amount ΔF of the modulated wave such that the magnitude of the reflection coefficient or the magnitude of the reflected wave power reduces. FIG. 4 is a diagram illustrating a relationship between the start phase θst of the modulation signal, the frequency shift amount ΔF of the modulated wave, and the reflection coefficient. FIG. 5 is a diagram illustrating the concept of the gradient method.

Although a case will be exemplified below in which the search processing of the start phase θst of the modulation signal and the search processing of the frequency shift amount ΔF of the modulated wave are repeatedly performed such that the magnitude of the reflection coefficient reduces, the same applies to a case where the search processing of the start phase θst of the modulation signal and the search processing of the frequency shift amount ΔF of the modulated wave are repeatedly performed such that the magnitude of the reflected wave power reduces. In other words, although a case will be exemplified in which the feedback value for the control amount (the start phase θst and the frequency shift amount ΔF) is the reflection coefficient, the same applies to a case where the feedback value for the control amount is the reflected power.

In FIG. 4, the lateral axis represents the start phase θst, the longitudinal axis represents the frequency shift amount ΔF, and the vertical axis represents the reflection coefficient F. The vertical axis is an axis perpendicular to a plane defined by the lateral axis and the longitudinal axis. As a result of considering a change in the reflection coefficient Γ when the start phase θst of the modulation signal and the frequency shift amount ΔF of the modulated wave are changed, it has been found that the minimum point is obtained at substantially one point as illustrated in FIG. 4. Therefore, it is expected that the start phase θst and the frequency shift amount ΔF that minimize the reflection coefficient Γ can be efficiently determined by applying the gradient method to each of the search processing of the start phase θst and the search processing of the frequency shift amount ΔF of the modulated wave.

When a graph of a certain function is considered, the gradient method searches for a minimum point by utilizing the fact that the minimum point is on the left side (smaller side) if the slope of the tangent of a certain coordinate point is positive, and the minimum point is on the right side (larger side) if the slope of the tangent of a certain coordinate point is negative. The slope of the tangent can be approximated by the slope of a straight line connecting a certain coordinate point and its neighboring point.

As illustrated in FIG. 5, a feedback value Y changes as a nonlinear function Y=f (X) depending on the value of a control amount X. FIG. 5 illustrates a graph of the function Y=f (X) in which the minimum point is approximately one point. In the present embodiment, the control amount X is a combination of the start phase θst and the frequency shift amount ΔF, and the feedback value Y is the reflection coefficient Γ (see FIG. 4).

The operation of the HF power supply 10 according to the gradient method is as follows. The HF power supply 10 gives a start value $X_s$ to the control amount at the start and checks the feedback value at the point of time. Since there is no past feedback value at the start, the HF power supply 10 changes the control amount by the initial value (i.e., +1 or −1, or +1 in this case) as the control amount addition value. The HF power supply 10 compares the current feedback value with the previous feedback value. When the current feedback value becomes lower than the previous feedback value, the HF power supply 10 determines that the slope of the tangent at the current coordinate point is negative, and changes "(previous control amount)+1" to the current control amount. When the current feedback value becomes higher than the previous feedback value, the HF power supply 10 determines that the slope of the tangent at the current coordinate point is positive, and changes "(previous control amount)−1" to the current control amount. At the point of time, the HF power supply 10 records the past feedback value.

After the recording, the comparison of the feedback values and the change of the control amount are repeated up to a designated number of times.

In the case of FIG. 5, the minimum point at which the feedback value is minimized is searched for by the gradient method as described in the following (1) to (9).

(1) The HF power supply 10 is operated at $X=X_s$ as a start value of the control amount to obtain a feedback value $Y=f(X_s)$.

(2) The HF power supply 10 changes the control amount to $X=X_s+1$ and records the previous feedback value. The current feedback value is $Y=f(X_s+1)$, and the previous feedback value is $Y=f(X_s)$.

(3) The HF power supply 10 compares the current feedback value $Y=f(X_s+1)$ with the previous feedback value $Y=f(X_s)$. As illustrated in FIG. 5, since "f $(X_s+1)$<f $(X_s)$", the HF power supply 10 adds the control amount by +1 to be $X=X_s+2$.

(4) The HF power supply 10 compares the current feedback value $Y=f(X_s+2)$ with the previous feedback value $Y=f(X_s+1)$. As illustrated in FIG. 5, since "f $(X_s+2)$<f $(X_s+1)$", the HF power supply 10 adds the control amount by +1 to be $X=X_s+3$.

(5) The HF power supply 10 compares the current feedback value $Y=f(X_s+3)$ with the previous feedback value $Y=f(X_s+2)$. As illustrated in FIG. 5, since "f $(X_s+3)$<f $(X_s+2)$", the HF power supply 10 adds the control amount by +1 to be $X=X_s+4$.

(6) The HF power supply 10 compares the current feedback value $Y=f(X_s+4)$ with the previous feedback value $Y=f(X_s+3)$. As illustrated in FIG. 5, since "f $(X_s+4)$>f $(X_s+3)$", the HF power supply 10 multiplies the control amount addition value by −1 to be the control amount addition value of (+1)×(−1)=−1. This multiplication is equivalent to reversing the change direction. The HF power supply 10 adds the control amount by −1 to be X=X$_3$+3.

(7) The HF power supply 10 compares the current feedback value Y=f (X$_s$+3) with the previous feedback value Y=f (X$_s$+4). As illustrated in FIG. 5, since "f (X$_s$+3)<f (X$_s$+4)", the HF power supply 10 adds the control amount by −1 to be X=X$_s$+2.

(8) The HF power supply 10 compares the current feedback value Y=f (X$_s$+2) with the previous feedback value Y=f (X$_s$+3). As illustrated in FIG. 5, since "f (X$_s$+2)>f (X$_s$+3)", the HF power supply 10 multiplies the control amount addition value by −1 to be the control amount addition value of (−1)×(−1)=+1. This multiplication is equivalent to reversing the change direction. The HF power supply 10 adds the control amount by +1 to be X=X$_s$+3.

(9) (5) to (8) are repeated until the designated number of times is reached.

Figure 6A:
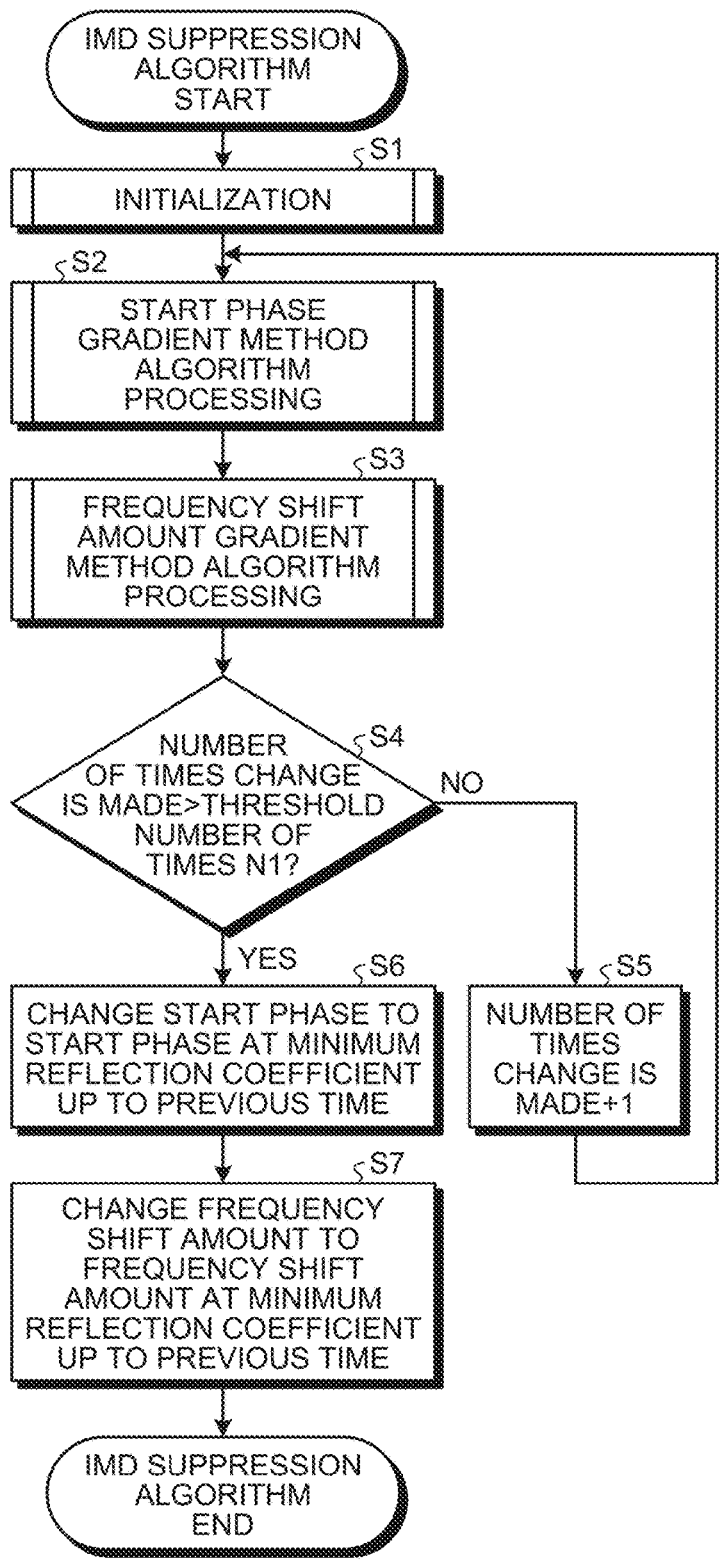
FIGS. 6A and 6B are flowcharts illustrating a flow of frequency modulation control in the embodiment.
Figure 6B:
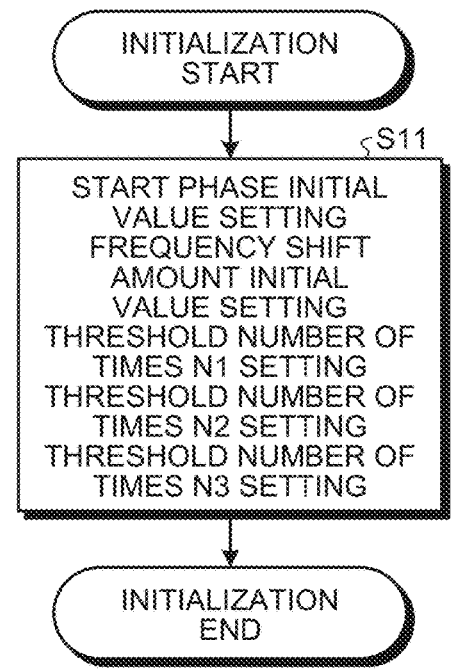
Figure 7:
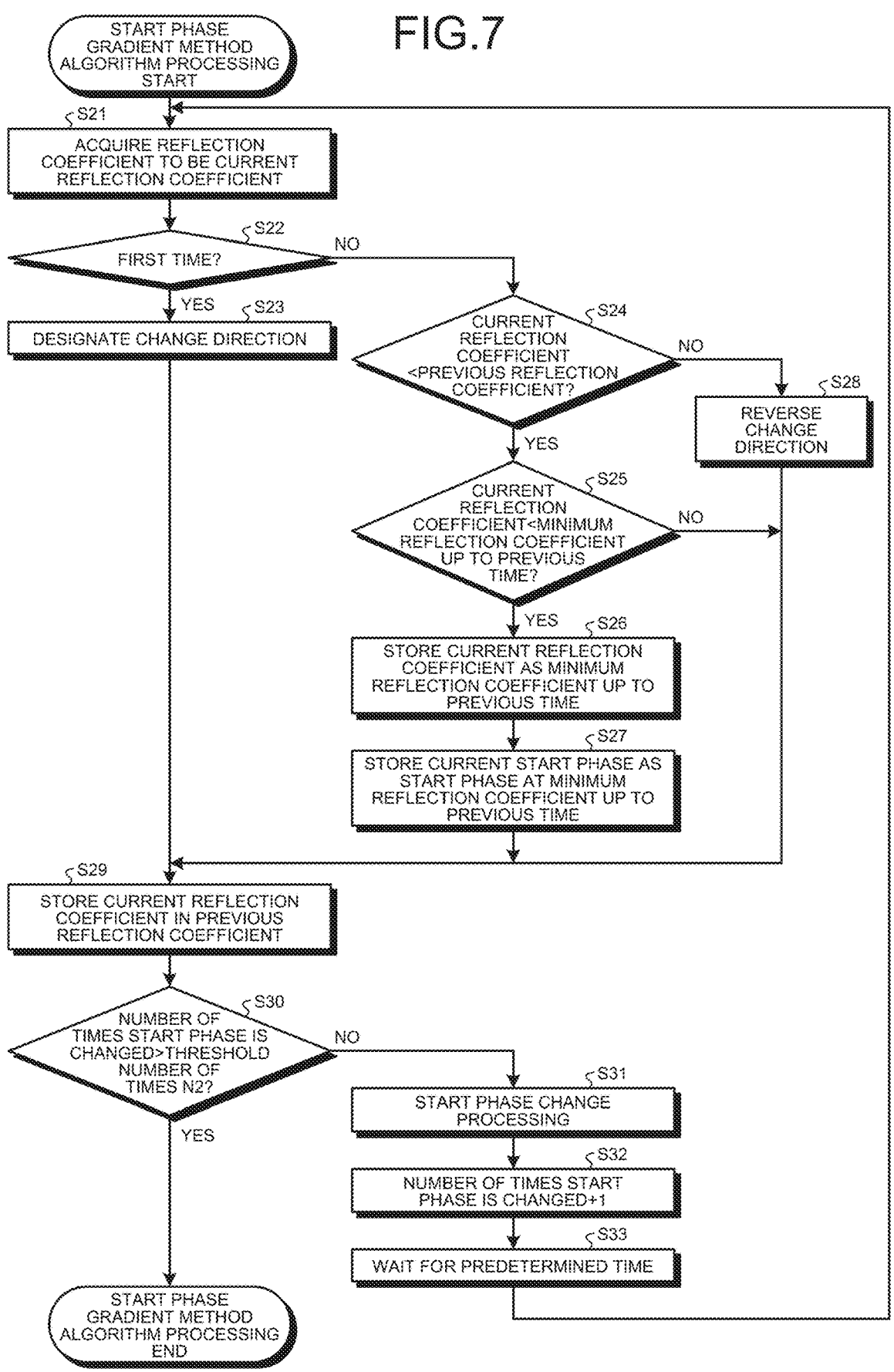
FIG. 7 is a flowchart illustrating search processing of the start phase of the modulation signal according to the embodiment.
Figure 8:
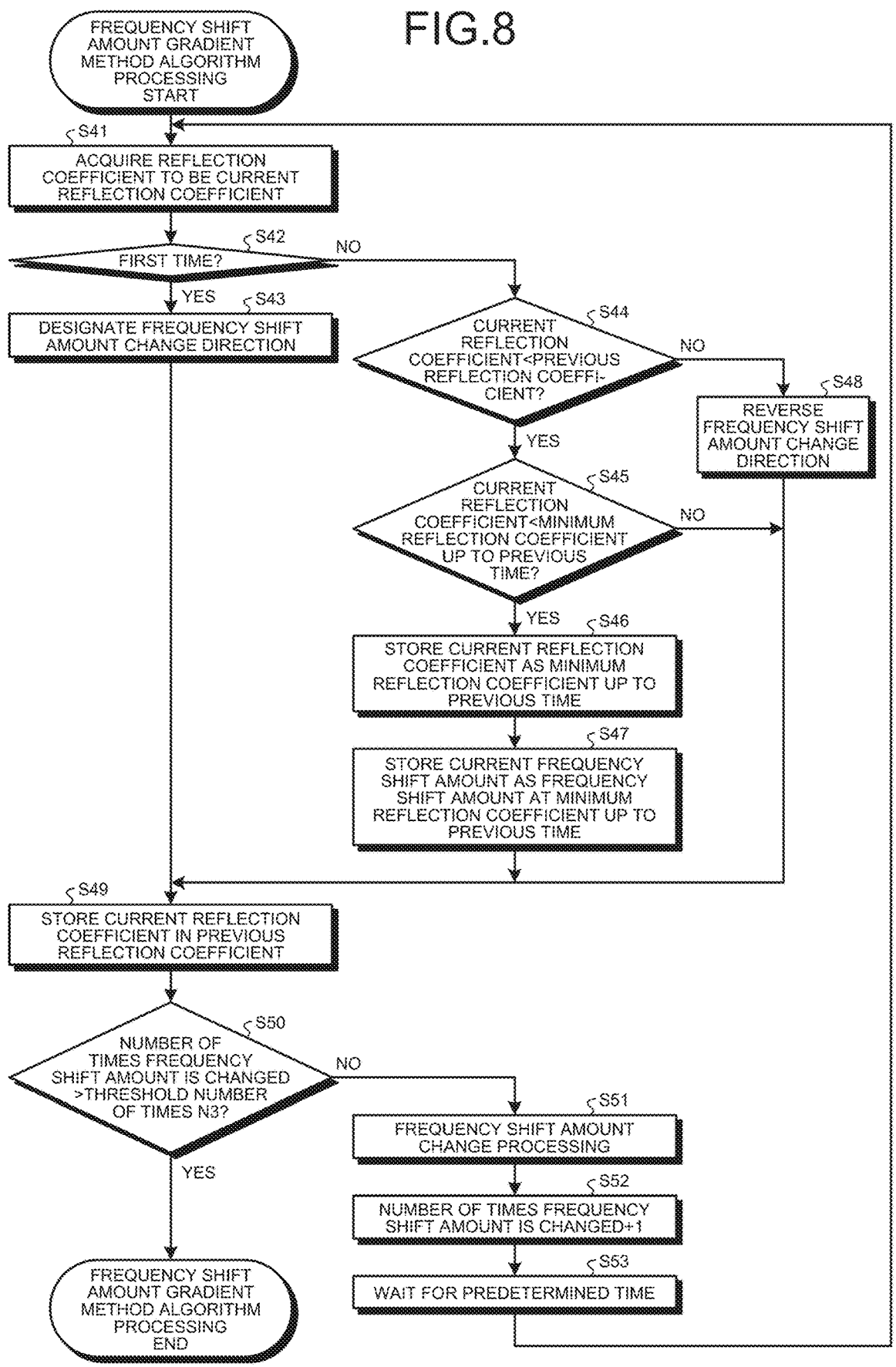
FIG. 8 is a flowchart illustrating search processing of the frequency shift amount of the modulated wave according to the embodiment.

Details of the frequency modulation control will now be described with reference to FIGS. 6A and 6B. FIG. 6A is a flowchart illustrating a flow of an IMD suppression algorithm. The IMD suppression algorithm is an algorithm for frequency modulation control. When the IMD suppression algorithm is started, the HF power supply 10 performs initialization processing (S1). In the initialization processing (S1), the HF power supply 10 performs S11 illustrated in FIG. 6B. FIG. 6B is a flowchart illustrating the flow of the initialization processing (S1). In S11, the HF power supply 10 sets initial values for the start phase θst and the frequency shift amount ΔF. The HF power supply 10 sets predetermined values of numbers of times to a threshold number of times N1, a threshold number of times N2, and a threshold number of times N3. The threshold number of times N1 is the maximum number of times that loop processing in S2 to S5 is repeated in the flow of the frequency modulation control illustrated in FIGS. 6A and 6B. The threshold number of times N2 is the maximum number of times that loop processing in S21 to S33 is repeated in the flow of the phase gradient method algorithm processing illustrated in FIG. 7. FIG. 7 is a flowchart illustrating the flow of start phase gradient method algorithm processing. The threshold number of times N3 is the maximum number of times that loop processing in S41 to S53 is repeated in the flow of frequency shift amount gradient method algorithm processing illustrated in FIG. 8. FIG. 8 is a flowchart illustrating the flow of the frequency shift amount gradient method algorithm processing.

Referring back to FIG. 6A, the HF power supply 10 performs the start phase gradient method algorithm processing (S2). The start phase gradient method algorithm processing (S2) is search processing of the start phase θst of the modulation signal, and the processes in S21 to S33 illustrated in FIG. 7 are performed. When the start phase gradient method algorithm processing is started, the HF power supply 10 resets each of the parameters "the number of times the start phase is changed", "the current reflection coefficient", "the previous reflection coefficient", and "the minimum reflection coefficient up to the previous time" to an initial value (e.g., zero). The HF power supply 10 acquires the reflection coefficient Γ to be the current reflection coefficient Γ (S21). The HF power supply 10 applies power to the HF matching unit 91, and detects each of the waveform of the traveling wave voltage detection signal Vf2 and the waveform of the reflected wave voltage detection signal Vr2. Further, the averaging unit 21 calculates the traveling wave power Pf based on the traveling wave voltage detection signal Vf2 and calculates the reflected wave power Pr based on the reflected wave voltage detection signal Vr2. The reflection coefficient Γ is obtained based on the traveling wave power Pf and the reflected wave power Pr. The HF power supply 10 holds the obtained reflection coefficient Γ as the current reflection coefficient Γ. The HF power supply 10 checks the parameter "the number of times the start phase is changed" and determines whether or not the loop processing in S21 to S33 is the first time (S22). If the loop processing is performed for the first time (Yes in S22), the HF power supply 10 designates the change direction of the start phase θst to the default direction (S23). The default direction is, for example, an increasing direction. If the loop processing is the second or subsequent loop processing (No in S22), the HF power supply 10 determines whether or not the current reflection coefficient Γ is smaller than the previous reflection coefficient Γ (S24). If the current reflection coefficient Γ is smaller than the previous reflection coefficient Γ (Yes in S24), the HF power supply 10 determines whether or not the current reflection coefficient Γ is smaller than the minimum reflection coefficient Γ up to the previous time (S25). The minimum reflection coefficient Γ up to the previous time means the minimum reflection coefficient r from the start of the start phase gradient method algorithm processing up to the previous time.

If the current reflection coefficient Γ is smaller than the minimum reflection coefficient Γ up to the previous time (Yes in S25), the HF power supply 10 stores the current reflection coefficient Γ as "the minimum reflection coefficient up to the previous time" (S26) and stores the current start phase θst as "the start phase θst at the minimum reflection coefficient up to the previous time" (S27). If the current reflection coefficient Γ is greater than or equal to the previous reflection coefficient Γ (No in S24), the HF power supply 10 reverses the change direction of the start phase θst (S28). The HF power supply 10 sets the change direction to the decreasing direction when the current change direction is the increasing direction, and sets the change direction to the increasing direction when the current change direction is the decreasing direction. The HF power supply 10 stores the current reflection coefficient Γ as the "previous reflection coefficient" (S29), and determines whether or not the number of times the start phase is changed is greater than the threshold number of times N2 (S30). If the number of times the start phase is changed is less than or equal to the threshold number of times N2 (No in S30), the HF power supply 10 changes the start phase θst of the modulation signal in the current change direction (S31), increments the number of times the start phase is changed (S32), and returns the process to S21 after waiting for a predetermined time (e.g., 50 μs) (S33). If the number of times the start phase is changed is greater than the threshold number of times N2 (Yes in S30), the HF power supply 10 ends the start phase gradient method algorithm processing.

Referring back to FIG. 6A, the HF power supply 10 performs frequency shift amount gradient method algorithm processing (S3). The frequency shift amount gradient method algorithm processing (S3) is search processing of the frequency shift amount of the modulated wave, and the processes in S41 to 353 illustrated in FIG. 8 are performed. When the frequency shift amount gradient method algorithm processing is started, the HF power supply 10 resets each of the parameters "the number of times the frequency shift amount is changed", "the current reflection coefficient", "the previous reflection coefficient", "the minimum reflection coefficient up to the previous time", and "the frequency shift amount ΔF at the minimum reflection coefficient up to the previous time" to an initial value (e.g., zero). The HF power supply 10 acquires the reflection coefficient Γ to be the current reflection coefficient Γ (S41). The HF power supply 10 applies power to the HF matching unit 91, and detects each of the waveform of the traveling wave voltage detection signal Vf2 and the waveform of the reflected wave voltage detection signal Vr2. Further, the averaging unit 21 calculates the traveling wave power Pf based on the traveling wave voltage detection signal Vf2 and calculates the reflected wave power Pr based on the reflected wave voltage detection signal Vr2. The reflection coefficient Γ is obtained based on the traveling wave power Pf and the reflected wave power Pr. The HF power supply 10 holds the obtained reflection coefficient Γ as the current reflection coefficient Γ. The HF power supply 10 checks the parameter "the number of times the frequency shift amount is changed" and determines whether or not the loop processing in S41 to S53 is the first time (S42). If the loop processing is performed for the first time (Yes in S42), the HF power supply 10 designates the change direction of the frequency shift amount ΔF to the default direction (S43). The default direction is, for example, an increasing direction. If the loop processing is the second or subsequent loop processing (No in S42), the HF power supply 10 determines whether or not the current reflection coefficient Γ is smaller than the previous reflection coefficient Γ (S44). If the current reflection coefficient Γ is smaller than the previous reflection coefficient Γ (Yes in S44), the HF power supply 10 determines whether or not the current reflection coefficient Γ is smaller than the minimum reflection coefficient Γ up to the previous time (S45). The minimum reflection coefficient Γ up to the previous time means the minimum reflection coefficient Γ from the start of the frequency shift amount gradient method algorithm processing up to the previous time. If the current reflection coefficient Γ is smaller than the minimum reflection coefficient Γ up to the previous time (Yes in S45), the HF power supply 10 stores the current reflection coefficient Γ as "the minimum reflection coefficient up to the previous time" (S46), and stores the current start phase θst as "the frequency shift amount ΔF at the minimum reflection coefficient up to the previous time" (S4$^7$). If the current reflection coefficient Γ is greater than or equal to the previous reflection coefficient Γ (No in S44), the HF power supply 10 reverses the change direction of the frequency shift amount ΔF (S48). The HF power supply 10 sets the change direction to the decreasing direction when the current change direction is the increasing direction, and sets the change direction to the increasing direction when the current change direction is the decreasing direction. The HF power supply 10 stores the current reflection coefficient Γ as the "previous reflection coefficient" (S49), and determines whether or not the number of times the frequency shift amount is change is greater than the threshold number of times N3 (350). If the number of times the frequency shift amount is changed is less than or equal to the threshold number of times N3 (No in 350), the HF power supply 10 changes the frequency shift amount ΔF of the modulated wave in the current change direction (S51), increments the number of times the frequency shift amount is changed (352), and returns the process to S21 after waiting for a predetermined time (e.g., 50 μs) (S53). If the number of times the frequency shift amount is change is greater than the threshold number of times N3 (Yes in S50), the HF power supply 10 ends the frequency shift amount gradient method algorithm processing.

Referring back to FIG. 6A, the HF power supply 10 determines whether or not the number of times the change is made is greater than the threshold number of times N1 (S4). If the number of times the change is made is less than or equal to the threshold number of times N1 (No in S4), the HF power supply 10 increments the number of times the change is made (S5), and returns the process to S2. If the number of times the change is made is greater than the threshold number of times N1 (Yes in S4), the HF power supply 10 changes the start phase θst of the modulation signal to the "start phase θst at the minimum reflection coefficient up to the previous time" stored in the previous S26 (see FIG. 7) (S6), changes the frequency shift amount ΔF of the modulated wave to the "frequency shift amount ΔF at the minimum reflection coefficient up to the previous time" stored in the previous S46 (see FIG. 8) (S7), and ends the process.

As described above, in the present embodiment, the high-frequency power supply device 1 repeatedly performs search processing of the start phase θst of the modulation signal and search processing of the frequency shift amount ΔF of the modulated wave such that the magnitude of the reflection coefficient (or reflected wave power) reduces. For example, the high-frequency power supply device searches for the start phase θst of the modulation signal at which the magnitude of the reflection coefficient (or reflected wave power) is minimized when the frequency modulation control is performed in a state where the frequency shift amount ΔF of the modulated wave is fixed, and searches for the frequency shift amount ΔF of the modulated wave at which the magnitude of the reflection coefficient (or reflected wave power) is minimized when the frequency modulation control is performed in a state where the start phase θst of the modulation signal is fixed. Thus, it is possible to effectively optimize the parameter of the frequency modulation control and to effectively suppress intermodulation distortion.

Note that the search processing of the start phase θst of the modulation signal and the search processing of the frequency shift amount ΔF of the modulated wave may be performed by a method (sweep method) of searching while sweeping a parameter within a changeable range, instead of the gradient method.

According to the high-frequency power supply device of the present disclosure, intermodulation distortion can be effectively suppressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A high-frequency power supply device comprising:
   a first power supply that supplies first high-frequency power to a load by outputting a first high-frequency voltage having a first fundamental frequency;
   a second power supply that supplies second high-frequency power to the load by outputting a second high-frequency voltage having a second fundamental frequency lower than the first fundamental frequency;
   a first matching unit connected between the first power supply and the load; and
   a second matching unit connected between the second power supply and the load, wherein
   when performing frequency modulation control for frequency-modulating the first high-frequency voltage with a modulation signal having a same frequency as the second fundamental frequency and outputting it as a modulated wave, the first power supply repeatedly performs search processing of a start phase of the modulation signal and search processing of a frequency shift amount of the modulated wave such that magnitude of a reflection coefficient or magnitude of reflected wave power reduces.

2. The high-frequency power supply device according to claim 1, wherein the first power supply has a function of calculating magnitude of a reflection coefficient or magnitude of reflected wave power, based on information detected in the first power supply, the search processing of the start phase of the modulation signal is search processing of searching for a start phase of the modulation signal at which magnitude of the reflection coefficient or the magnitude of the reflected wave power is minimized when the frequency modulation control is performed while changing the start phase of the modulation signal within a predetermined range in a state where the frequency shift amount of the modulated wave is fixed, and the search processing of the frequency shift amount of the modulated wave is search processing of searching for a frequency shift amount of the modulated wave at which the magnitude of the reflection coefficient or the magnitude of the reflected wave power is minimized when the frequency modulation control is performed while changing the frequency shift amount of the modulated wave within a predetermined range in a state where the start phase of the modulation signal is fixed.

3. The high-frequency power supply device according to claim 1, wherein the first power supply performs each of the search processing of the start phase of the modulation signal and the search processing of the frequency shift amount of the modulated wave by a gradient method.

4. The high-frequency power supply device according to claim 3, wherein the first power supply compares, in the search processing of the start phase of the modulation signal, the magnitude of the reflection coefficient or the magnitude of the reflected wave power when the frequency modulation control is performed with magnitude of a reflection coefficient or magnitude of reflected wave power when previous search processing of the start phase of the modulation signal is performed, changes, according to a comparison result, the start phase of the modulation signal in a direction in which the magnitude of the reflection coefficient or the magnitude of the reflected wave power reduces, compares, in the search processing of the frequency shift amount of the modulated wave, the magnitude of the reflection coefficient or the magnitude of the reflected wave power when the frequency modulation control is performed with the magnitude of the reflection coefficient or the magnitude of the reflected wave power when previous search processing of the frequency shift amount of the modulated wave is performed, and changes, according to a comparison result, the frequency shift amount of the modulated wave in a direction in which the magnitude of the reflection coefficient or the magnitude of the reflected wave power reduces.

* * * * *